(12) United States Patent
Yoo et al.

(10) Patent No.: US 10,796,933 B2
(45) Date of Patent: Oct. 6, 2020

(54) DISPLAY DEVICE MANUFACTURING APPARATUS AND METHOD

(71) Applicant: Samsung Display Co., Ltd., Yongin-Si, Gyeonggi-Do (KR)

(72) Inventors: Haeyoung Yoo, Yongin-si (KR); Taejong Kim, Yongin-si (KR); Juhee Lee, Yongin-si (KR); Myungsoo Huh, Yongin-si (KR); Jaekyu Park, Yongin-si (KR); Hyunwoo Joo, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/173,950

(22) Filed: Oct. 29, 2018

(65) Prior Publication Data
US 2019/0341277 A1 Nov. 7, 2019

(30) Foreign Application Priority Data

May 2, 2018 (KR) .......................... 10-2018-0050678

(51) Int. Cl.
*H01L 21/67* (2006.01)
*H01J 37/32* (2006.01)
(Continued)

(52) U.S. Cl.
CPC .. *H01L 21/67069* (2013.01); *H01J 37/32449* (2013.01); *H01J 37/32633* (2013.01);
(Continued)

(58) Field of Classification Search
CPC ......... H01L 21/67069; H01L 21/31144; H01L 21/31116; H01L 21/0274; H01L 21/6719;
(Continued)

(56) References Cited

U.S. PATENT DOCUMENTS

| 7,552,521 | B2 | 6/2009 | Fink |
| 7,648,610 | B2 | 1/2010 | Komiya et al. |
| 2001/0024681 | A1* | 9/2001 | Hasegawa ............... H01J 9/027 427/77 |
| 2004/0026372 | A1 | 2/2004 | Takenaka et al. |
| 2011/0042009 | A1* | 2/2011 | Lee ................... H01J 37/32449 156/345.43 |

(Continued)

FOREIGN PATENT DOCUMENTS

| KR | 10-0593256 B1 | 6/2006 |
| KR | 10-2007-0083779 A | 8/2007 |

(Continued)

OTHER PUBLICATIONS

Tsuyoshi Moriya, Eiichi Sugawara, and Hidefumi Matsui, "Observation and Elimination of Recoil Particles From Turbo Molecular Pumps", IEEE Transactions on Semiconductor Manufacturing, vol. 28, No. 3, Aug. 2015, 7 pages.

*Primary Examiner* — Kyoung Lee
*Assistant Examiner* — Christina A Sylvia
(74) *Attorney, Agent, or Firm* — Innovation Counsel LLP (57) ABSTRACT

Provided is a display device manufacturing apparatus and a manufacturing method of a display device. The display device manufacturing apparatus includes: a chamber; a supporter arranged in the chamber and supporting a substrate; an electrode arranged in the chamber so as to face the supporter; a gas supply arranged in the chamber and configured to supply process gas into the chamber; a first baffle arranged at a rim of the supporter and having at least one first through hole; and a second baffle arranged between the first baffle and the chamber and covering the at least one first through hole in a plan view to alter a path of by-products discharged from the chamber.

8 Claims, 10 Drawing Sheets

(51) Int. Cl.
*H01L 27/12* (2006.01)
*H01L 21/311* (2006.01)
*H01L 21/027* (2006.01)
*H01L 27/32* (2006.01)

(52) U.S. Cl.
CPC .... *H01L 21/0274* (2013.01); *H01L 21/31116* (2013.01); *H01L 21/31144* (2013.01); *H01L 27/1288* (2013.01); *H01L 27/3244* (2013.01); *H01J 2237/334* (2013.01); *H01L 2227/323* (2013.01)

(58) Field of Classification Search
CPC ........... H01L 21/67017; H01L 27/1288; H01L 27/3244; H01L 27/1259; H01L 27/1248; H01L 2227/323; H01J 37/32449; H01J 37/32633; H01J 2237/334
See application file for complete search history.

(56) References Cited

U.S. PATENT DOCUMENTS

| | | | | |
|---|---|---|---|---|
| 2013/0075037 A1* | 3/2013 | Matsudo | ........... | H01J 37/32091 156/345.44 |
| 2013/0284288 A1* | 10/2013 | Kim | .................... | H01L 21/6719 137/526 |
| 2017/0162401 A1* | 6/2017 | Kang | ................ | H01J 37/32715 |

FOREIGN PATENT DOCUMENTS

| | | |
|---|---|---|
| KR | 10-2008-0013192 A | 2/2008 |
| KR | 10-2014-0144383 A | 12/2014 |
| KR | 10-1490431 B1 | 2/2015 |
| KR | 10-1568363 B1 | 11/2015 |
| KR | 10-2017-0066080 A | 6/2017 |
| KR | 10-2018-0014900 A | 2/2018 |

* cited by examiner

DISPLAY DEVICE MANUFACTURING APPARATUS AND METHOD

CROSS-REFERENCE TO RELATED APPLICATION

This application claims the benefit of Korean Patent Application No. 10-2018-0050678, filed on May 2, 2018, in the Korean Intellectual Property Office, the disclosure of which is incorporated herein in its entirety by reference.

BACKGROUND

1. Field

One or more embodiments relate to a display device manufacturing apparatus and a manufacturing method of a display device.

2. Description of the Related Art

Mobility based electronic devices have a wide range of uses. A tablet personal computer (PC) has been recently used as a mobile electronic device, in addition to a small electronic device such as a mobile phone.

The mobile electronic device includes a display device for providing visual information such as images or moving images to users in order to support various functions. As components for driving the display device have recently become smaller, a portion of the display device that occupies an electronic device has increased, and a structure of the display device that may be bent to have a predetermined angle from a flat state has been developed.

In order to manufacture such a display device, various layers may be formed and portions of these layers may be removed to form a pattern. When one of the layers is patterned, process by-products are produced in a chamber, and the process by-products adhere to the patterned layer. Thus the display device may have a poor product quality. In order to prevent this, gas and process by-products inside the chamber may be discharged to the outside during the process of forming a pattern of layers.

SUMMARY

When process by-products and gas used for a process are discharged to the outside, the process by-products and gas flow back into a chamber and adhere to each layer at the time of manufacturing a display device to cause defects. Therefore, it is necessary to prevent backflow of such process by-products and gas. One or more embodiments include a display device manufacturing apparatus and a manufacturing method of a display device that minimize product defects by minimizing backflow of process by-products and gas in a chamber and effectively discharging the by-products and gas.

Additional aspects will be set forth in part in the description which follows and, in part, will be apparent from the description, or may be learned by practice of the presented embodiments.

According to one or more embodiments, a display device manufacturing apparatus includes: a chamber; a supporter arranged in the chamber and supporting a substrate; an electrode arranged in the chamber so as to face the supporter; a gas supply arranged in the chamber and configured to supply process gas into the chamber; a first baffle arranged at a rim of the supporter and having at least one first through hole; and a second baffle arranged between the first baffle and the chamber, and covering the at least one first through hole in a plan view to alter a path of by-products discharged from the chamber.

At least one inner surface of the first through hole may be inclined with respect to one of an upper surface and a lower surface of the first baffle.

At least a portion of at least one inner surface of the first through hole may protrude into the first through hole.

The display device manufacturing apparatus may further include a gas discharger connected to the chamber and configured to discharge the gas.

The gas discharger may include: a guide pipe connected to the chamber and configured to guide the gas to the outside; and a pump connected to the guide pipe and configured to discharge the gas to the outside.

The second baffle may be arranged to completely overlap a hole of the guide pipe in a plan view.

The display device manufacturing apparatus may further include a blocking plate configured to protrude from one surface of at least one of the first baffle and the second baffle.

The blocking plate may be inclined with respect to the one surface of at least one of the first baffle and the second baffle.

The display device manufacturing apparatus may further include a baffle supporter connected to the chamber and connected to at least one of the first baffle and the second baffle.

A baffle supporter may be in the form of a plate and has one or more second through holes.

According to one or more embodiments, a display device manufacturing apparatus includes: a chamber; a supporter arranged in the chamber and supporting a substrate; an electrode arranged in the chamber so as to face the supporter; a gas supply arranged in the chamber and configured to supply process gas into the chamber; and a plurality of baffles, which are arranged at a rim of the supporter and spaced apart from each other, wherein one baffle of the plurality of baffles has a through hole through which by-products is discharged, and wherein another baffle of the plurality of baffles covers the through hole in a plan view and alter a path of the by-products discharged from the chamber.

According to one or more embodiments, a manufacturing method of a display device includes: forming a pattern layer on a substrate; forming a photoresist pattern on the pattern layer to expose a portion of the pattern layer; placing the substrate on a support in a chamber; removing the portion of the pattern layer exposed by the photoresist pattern and discharging by-products from the chamber through a first baffle and a second baffle during the removing the portion of the pattern layer, wherein the first baffle has a first through hole through which the by-products is discharged, and wherein the second baffle covers the first through hole in a plan view and alter a path of the by-products discharged from the chamber.

The second baffle may completely cover the through hole in a plan view.

The first through hole in an upper surface and in a lower surface of the first baffle has different areas.

An inner surface of the first through hole may be inclined with respect to one of an upper surface and a lower surface of the first baffle.

At least a portion of the inner surface of the first through hole may protrude into the first through hole.

A blocking plate may be arranged on a lower surface of at least one of the first baffle and the second baffle.

The first baffle and the second baffle may be supported by baffle supporters spaced apart from each other.

A guide pipe may be connected to the chamber so as to guide the by-products inside of the chamber to the outside of the chamber, and the second baffle may be disposed between the first baffle and the guide pipe.

The second baffle may be arranged to completely cover a hole in the guide pipe.

These general and specific embodiments may be implemented by using a system, a method, a computer program, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Since the present disclosure may have diverse modified embodiments, preferred embodiments are illustrated in the drawings and are described in the detailed description. Advantages and features of the embodiments, and implementation methods thereof will be clarified through following embodiments described with reference to the accompanying drawings. In this regard, an embodiment of the disclosure may have different forms and should not be construed as being limited to the descriptions set forth herein.

Reference will now be made in detail to embodiments, examples of which are illustrated in the accompanying drawings, wherein the same reference numerals refer to the same elements throughout, and repeated description thereof will be omitted. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of description. In other words, since sizes and thicknesses of components in the drawings are arbitrarily illustrated for convenience of description, the following embodiments are not limited thereto.

Furthermore, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 1:
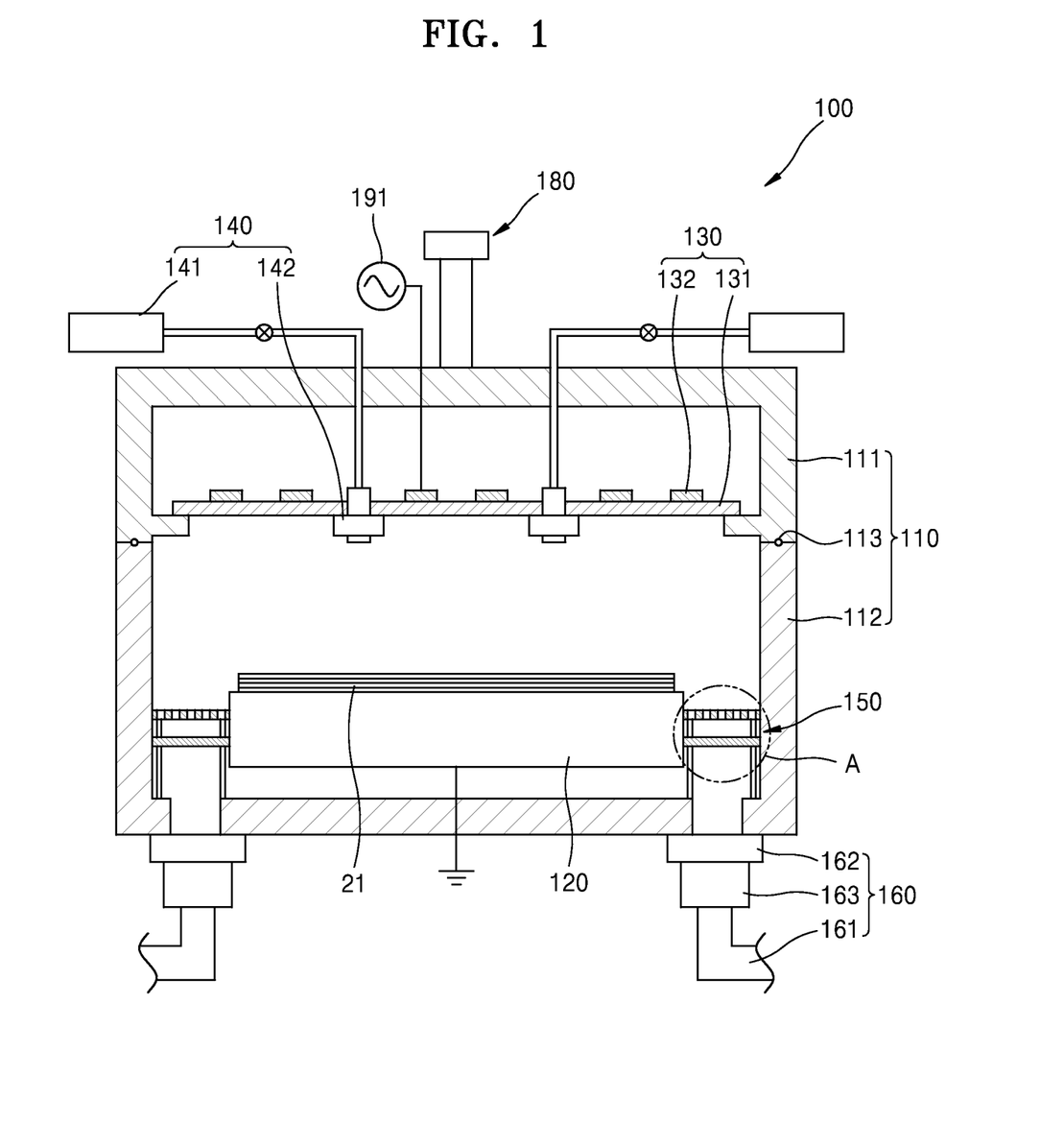
FIG. 1 is a cross-sectional view of a display device manufacturing apparatus according to an embodiment.
Figure 2:
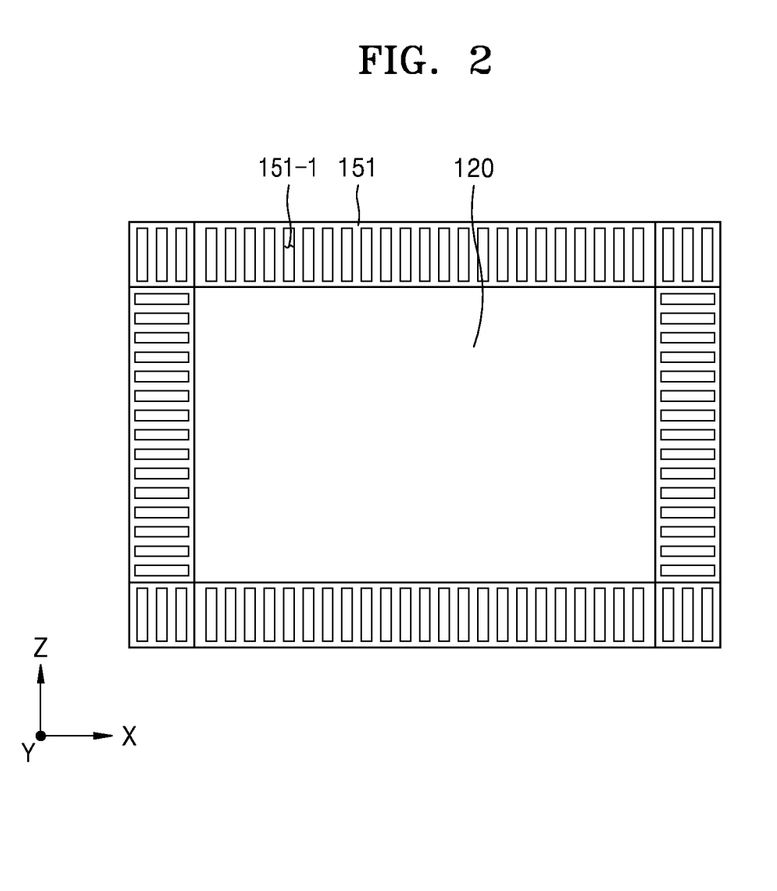
FIG. 2 is a plan view of a supporter and a first baffle shown in FIG. 1.

FIG. 1 is a cross-sectional view of a display device manufacturing apparatus according to an embodiment. FIG. 2 is a plan view of a supporter and a first baffle shown in FIG. 1. FIGS. 3A to 3F is a cross-sectional view of various embodiments of a first through hole in the first baffle shown in FIG. 2. FIG. 4 is a partial perspective view of portion A shown in FIG. 1.

Referring to FIGS. 1 to 4, a display device manufacturing apparatus 100 may include a chamber 110, a supporter 120, an electrode 130, a gas supply 140, a baffle 150, a gas discharger 160, a baffle supporter 171, and a chamber driver 180.

The chamber 110 may have a space therein and may provide a space in which a substrate 21 is arranged. The chamber 110 may include a first housing 111 and a second housing 112 that are separated from each other. In addition, the chamber 110 may include a sealing 113 between the first housing 111 and the second housing 112. In this case, the first housing 111 and the second housing 112 may be separated from each other, and at least one of the separated first housing 111 and the second housing 112 linearly moves so that the first housing 111 and the second housing 112 may be coupled to or separated from each other. Hereinafter, for convenience of description, a case where the first housing 111 linearly moves will be mainly described in detail.

A voltage applied to the supporter 120 and the electrode 130 may vary. For example, one of the supporter 120 and the electrode 130 may be connected to an external ground, and a certain positive voltage may be applied to the other one of the supporter 120 and the electrode 130. As another embodiment, a negative voltage may be applied to one of the supporter 120 and the electrode 130, and a positive voltage may be applied to the other one of the supporter 120 and the electrode 130. Hereinafter, for convenience of description, a case where the supporter 120 is connected to a ground and the electrode 130 is connected to an external power source will be mainly described in detail.

The supporter 120 may be disposed on a bottom surface of the second housing 112. The supporter 120 may be stably attached to the bottom surface of the second housing 112 or may be spaced apart from the bottom surface (or lower surface) of the second housing 112 through a separate structure.

The electrode 130 may be disposed inside the chamber 110 and may be connected to an external power source 191. Here, a voltage having opposite polarity to that of the supporter 120 may be applied to the electrode 130, and the voltage applied to the electrode 130 may vary. The electrode 130 may include a dielectric 131 and an antenna 132 in contact with the dielectric 131 and connected to the external power source 191. Here, a current applied to the antenna 132 may affect the dielectric 131 to form a constant voltage across the dielectric 131.

The gas supply 140 may include a gas storage 141 for storing gas for generating plasma and a nozzle 142 connected to the gas storage 141 and injecting gas into the chamber 110. The gas storage 141 may be a tank shape. A plurality of nozzles 142 may be provided to be spaced apart from each other on the dielectric 131. Here, an insulating material may be on a surface of each of the nozzles 142 or between each of the nozzles 142 and the dielectric 131 such that the nozzles 142 and the dielectric 131 are insulated from each other.

The nozzle 142 may supply gas into the chamber 110. Here, the gas supplied from the nozzle 142 may include at least one of fluorine (F) and chlorine (Cl) and at least one of inert gas such as argon (Ar) and the like.

The baffle 150 may be disposed around the supporter 120. A plurality of baffles 150 may be provided, and the plurality of baffles 150 may be stacked on each other. In addition, the plurality of the baffles 150 may be arranged on the bottom surface of the second housing 112 to be spaced apart from the bottom surface of the second housing 112. In this case, the lowermost baffle 150 (or the baffle 150 closest to the bottom surface of the second housing 112) may not have a hole to prevent process by-products and gas from passing therethrough. A hole may be formed in the other baffles except for the lowermost baffle 150. Hereinafter, for convenience of description, a case where there are two baffles 150 will be mainly described in detail.

The baffle 150 may include a first baffle 151 and a second baffle 152. The first baffle 151 may be arranged to completely surround a rim of the supporter 120. That is, the first baffle 151 may form a closed-loop. The first baffle 151 may be formed with a first through hole 151-1. The first through hole 151-1 may be formed from an upper surface to a lower surface of the first baffle 151. However, the first through hole 151-1 is not limited to the above and may also have a shape in which at least a portion of the first through hole 151-1 is bent with respect to the lower surface or the upper surface of the first baffle 151. That is, an inner wall of the first through hole 151-1 may include all shapes except for a shape in which the first through hole 151-1 is formed in a straight line and is perpendicular to the lower surface or the upper surface of the first baffle 151. For example, an inner surface of at least a portion of the first through hole 151-1 may be inclined with respect to the upper surface or the lower surface of the first baffle 151.

Figure 3A:
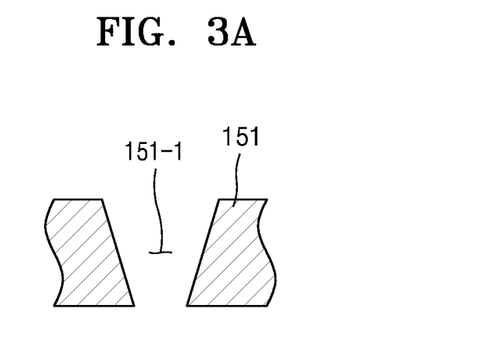
FIGS. 3A, 3B, 3C, 3D, 3E and 3F are a cross-sectional view of various embodiments of a first through hole in the first baffle shown in FIG. 2.
Figure 3B:
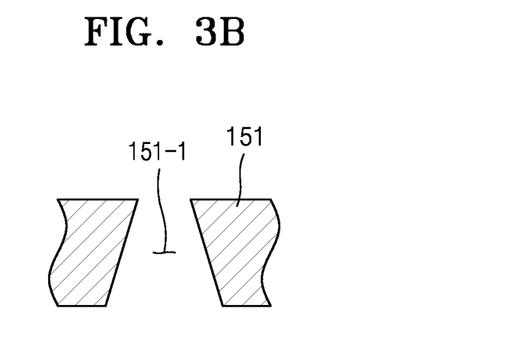
Figure 4:
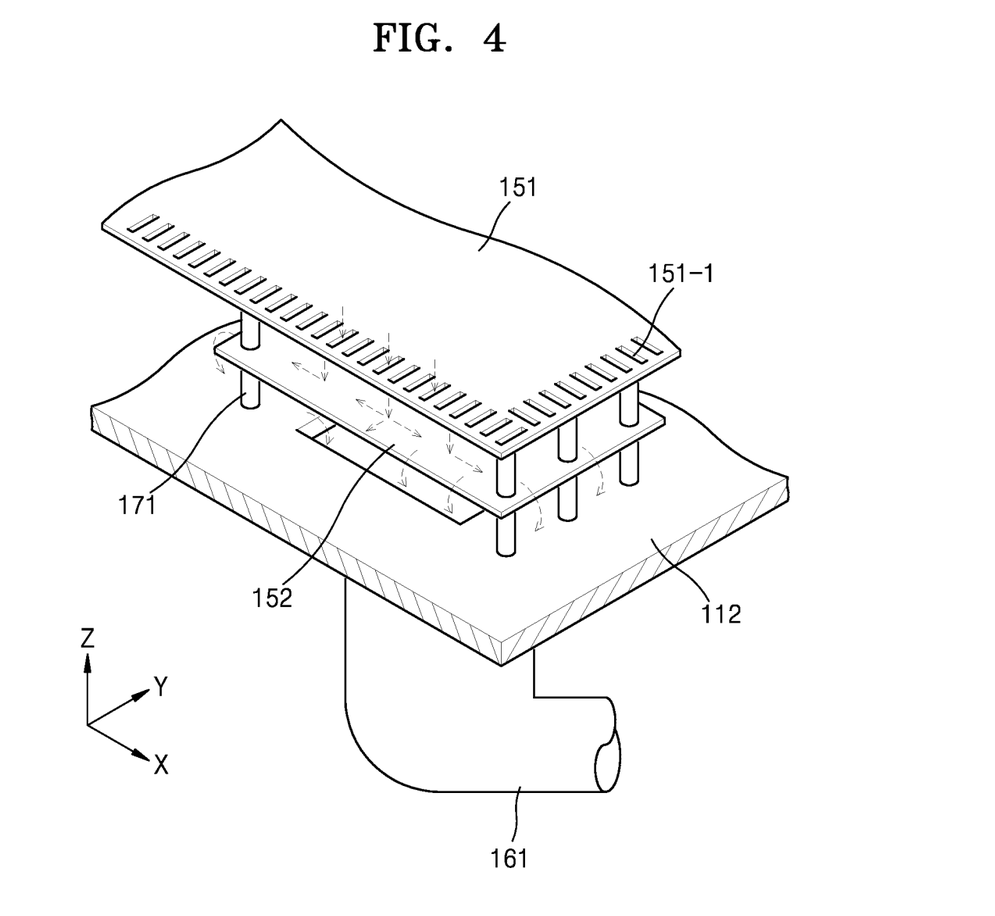
FIG. 4 is a partial perspective view of portion A shown in FIG. 1.

In an embodiment, as shown in FIG. 3A or FIG. 3B, a distance between inner surfaces of the first through hole 151-1 may increase or decrease toward the upper surface from the lower surface of the first baffle 151. In this case, an area of the first through hole 151-1 on the upper surface of the first baffle 151 and an area of the first through hole 151-1 on the lower surface of the first baffle 151 may be different from each other.

Figure 3C:
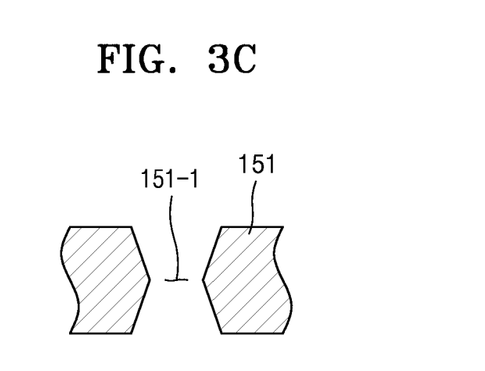
Figure 3D:
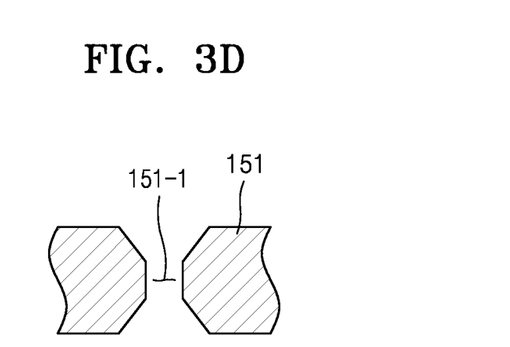
Figure 3E:
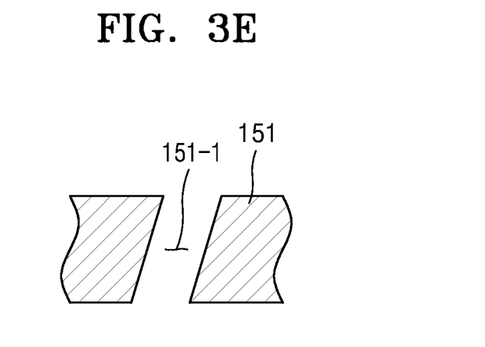

In another embodiment, as shown in FIG. 3E, the inner surfaces of the first through hole 151-1 may be inclined with respect to the lower surface of the first baffle 151, and a distance between the inner surfaces of the first through hole 151-1 may be constant from the lower surface to the upper surface of the first baffle 151. In this case, the area of the first through hole 151-1 on the upper surface of the first baffle 151 and the area of the first through hole 151-1 on the lower surface of the first baffle 151 may partially overlap with each other or may not overlap with each other in a plan view.

In another embodiment, at least a portion of the inner surfaces of the first through hole 151-1 may protrude inward. For example, the inner surfaces of the first through hole 151-1 may partially protrude inward as shown in FIG. 3C or FIG. 3D. In this case, a distance between the inner surfaces of the first through holes 151-1 may decrease as it goes from the upper surface to the lower surface of the first baffle 151 and may be increased again after passing a certain point.

Figure 3F:
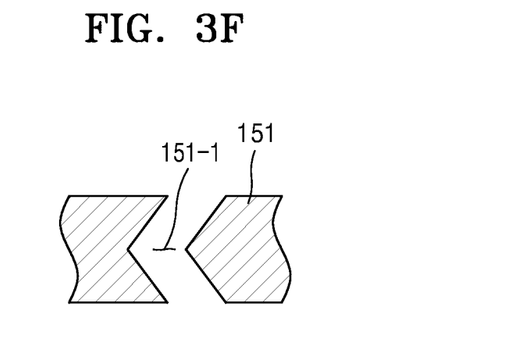

In another embodiment, the first through hole 151-1 may be formed to be bent at least once. For example, the first through hole 151-1 may be bent as shown in FIG. 3F.

A shape of the first through hole 151-1 may vary. For example, a cross-sectional shape of the first through hole 151-1 perpendicular to the upper and lower surfaces of the first baffle 151 may vary, such as a rectangle, a square, a circle, and a triangle. Hereinafter, for the convenience of description, a case where the cross-sectional shape of the first through hole 151-1 is a rectangle will be mainly described in detail.

The second baffle 152 may be formed in a plate shape so that gas passing through the first through hole 151-1 may collide the second baffle 152 and change path. For example, the second baffle 152 may change path of the gas moving from the upper surface to the lower surface of the second housing 112 through the first through hole 151-1 in a lateral direction of the second housing 112 because through-holes are not formed in the second baffle 152. The second baffle 152 may be formed to correspond to a portion of the second housing 112 to which a guide pipe 161 to be described later below is connected. That is, the second baffle 152 may be disposed above a portion of the second housing 112 to which a guide pipe 161 is connected. The second baffle 152 may completely cover a hole in the guide pipe 161 in a plan view. The second baffle 152 may overlap a portion of the first baffle 151. For example, the size of the second baffle 152 may be less than that of the first baffle 151. The first baffle 152 may completely cover the second baffle 152 in a plan view.

The gas discharger 160 may be connected to the chamber 110 to adjust pressure inside the chamber 110. The gas discharger 160 may include a guide pipe 161 connected to the second housing 112 to guide gas, a flow rate controller 162 in the guide pipe 161, and a pump 163 connected to the guide pipe 161. The flow rate controller 162 such as a solenoid valve may automatically adjust a flow rate according to an external signal. In this case, the flow rate controller 162 may open or close the guide pipe 161 or adjust an opening degree of the guide pipe 161. The pump 163 may include a turbo molecular pump.

The baffle supporter 171 is coupled to the baffle 150 and may support the baffle 150. The baffle supporter 171 may be connected to the chamber 110. In addition, the baffle supporter 171 may be connected to both the first baffle 151 and the second baffle 152. A plurality of baffle supporters 171 may be provided. The plurality of baffle supporters 171 may be spaced apart from each other along a side surface or a rim of the first baffle 151. In particular, the baffle supporter 171 may be adjacent to a side surface of the chamber 110 to support the first baffle 151. The baffle supporter 171 may be formed in a bar shape.

The chamber driver 180 may be connected to at least one of the first housing 111 and the second housing 112. In an embodiment, the chamber driver 180 may include a cylinder connected to at least one of the first housing 111 and the second housing 112. In another embodiment, the chamber driver 180 may include a linear motor connected to at least one of the first housing 111 and the second housing 112. In another example, the chamber driver 180 may include a rack gear connected to at least one of the first housing 111 and the second housing 112, a gear connected to the rack gear and linearly moving the rack gear, and a motor for rotating the gear. The chamber driver 180 is not limited to the above, may include any device and any structure connected to at least one of the first housing 111 and the second housing 112 and may be capable of linearly moving at least one of the connected first housing 111 and/or the second housing 112. Hereinafter, for convenience of description, the chamber driver 180 will be described in detail with reference to a case where the chamber driver 180 includes a cylinder connected to the first housing 111.

Meanwhile, the display device manufacturing apparatus 100 as described above may form plasma using gas supplied from the gas supply 140 during operation and may etch a portion of a pattern layer (not shown) on the substrate 21.

In this case, due to the etching of the pattern layer, process by-products (for example, separate gas) different from gas supplied from the outside may be generated and the process by-products may be contained within the chamber 110 along with some gas. In this case, the gas discharger 160 may discharge gas and process by-products in the chamber 110 to the outside or may transfer the gas and process by-products to a purifier or the like outside the chamber 110 to prevent process by-products from being adsorbed on a surface of the pattern layer etched by gas, or to prevent reaction of the surface of the pattern layer with the process by-products or gas. Here, the process by-products and gas may pass through the first baffle 151 and collide with an upper surface of the second baffle 152, and then may move along a space between the first baffle 151 and the second baffle 152. In addition, the process by-products and gas may pass between the plurality of baffle supporters 171 and move toward the guide pipe 161.

During the above process, the process by-products and gas may flow back into the chamber 110 after colliding with blades of the pump 163, a bottom of the chamber 110, and an inner surface of the guide pipe 161. The process by-products and gas may be adsorbed on the surface of the pattern layer, thereby causing product defects.

In this case, the first baffle 151 and the second baffle 152 may prevent the flowing back of the process by-products and gas. In more detail, the process byproducts and gas, which are reflected by the blades of the pump 163, a bottom surface of the chamber 110 and the guide pipe 161 may flow backward to the inside of the chamber 110. The process byproducts and gas which flow backward may collide with the second baffle 152, may not proceed further and may be attached to a lower surface of the second baffle 152 or may flow into the guide pipe 161 again. In addition, kinetic energy of the process by-products and gas which collide with the second baffle 152 and flow backward to the first baffle 151 is reduced due to the collision with the second baffle 152, so that the amount of the process by-products and gas passing through the first baffle 151 may be significantly reduced. In addition, the process by-products and gas passing through the second baffle 152 may not flow backward to the chamber 110 depending on a shape of the first through-hole 151-1. That is, at least a portion of the first through-hole 151-1 is inclined or bent with respect to the upper or lower surface of the first baffle 151 as described above, so that the process by-products and gas may collide with the inclined or bent inner surfaces of the first through hole 151-1 and may be reflected toward the second baffle 152. In particular, when the first through hole 151-1 is formed in a straight line perpendicular to the lower surface from the upper surface of the first baffle 151, the process by-products and gas may easily pass through the first through hole 151-1 without colliding with the inner surfaces of the first through hole 151-1. However, when the first through hole 151-1 is formed as described above, this phenomenon may be reduced.

Therefore, the display device manufacturing apparatus 100 may prevent process by-products generated during dry etching or gas used during a deposition process from flowing back to the chamber 110 to contaminate a product.

The display device manufacturing apparatus 100 may manufacture a high-quality product by preventing process by-products generated after dry etching from being adsorbed on a product.

Figure 5:
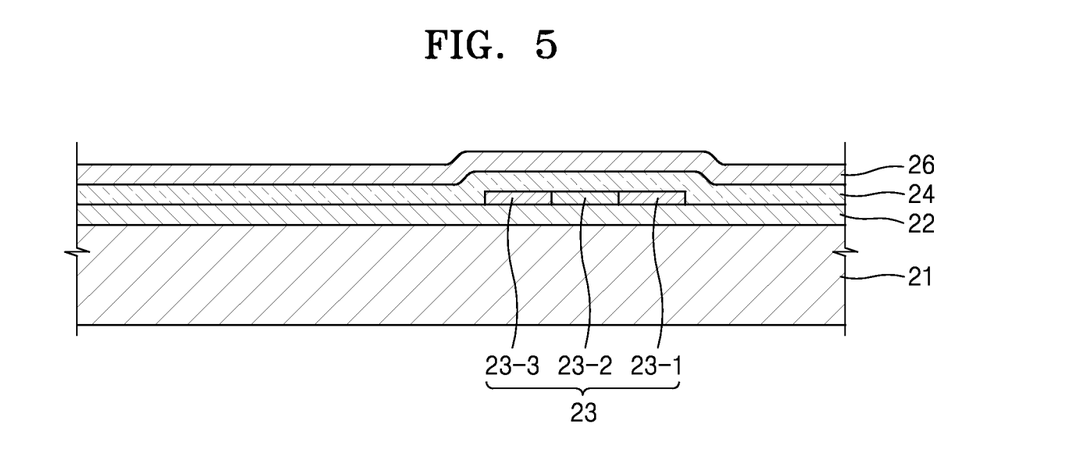
FIG. 5 is a cross-sectional view of an order of manufacturing a display device through the display device manufacturing apparatus shown in FIG. 1.
Figure 6:
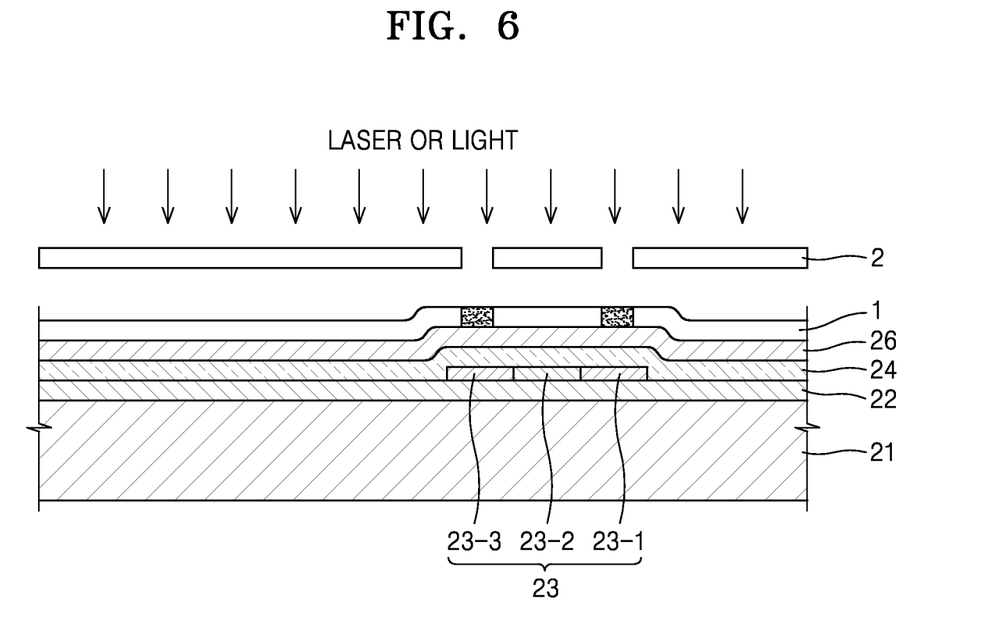
FIG. 6 is a cross-sectional view of an order of manufacturing a display device through the display device manufacturing apparatus shown in FIG. 1.
Figure 7:
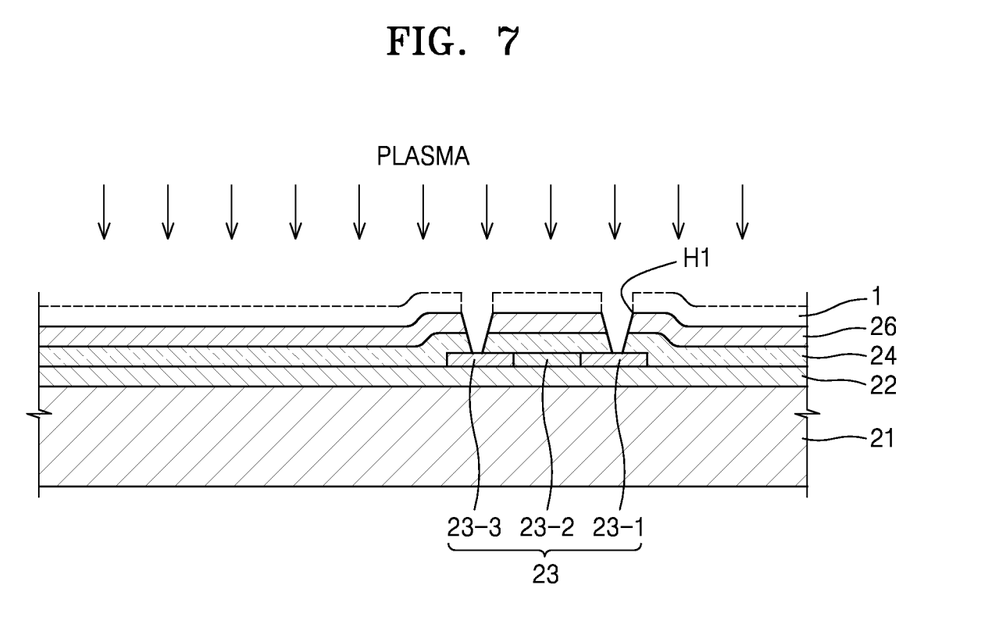
FIG. 7 is a cross-sectional view of an order of manufacturing a display device through the display device manufacturing apparatus shown in FIG. 1.

FIGS. 5, 6 and 7 are a cross-sectional view of an order of manufacturing a display device through the display device manufacturing apparatus 100 shown in FIG. 1.

Referring to FIGS. 5 to 7, the pattern layer may be formed after various layers are formed on the substrate 21, and the pattern layer may be dry-etched in the display device manufacturing apparatus 100 shown in FIGS. 1 to 4. Here, the pattern layer may include various layers of a display device (not shown). For example, the pattern layer may include a layer constituting a thin-film transistor (not shown). In another embodiment, the pattern layer may include a layer forming an electrode. However, the pattern layer is not limited thereto. The pattern layer may be formed with a pattern at the time of manufacturing the display device and may include all layers that can be produced through dry etching. Hereinafter, for convenience of description, a case where the pattern layer includes a gate insulating layer 24 and an interlayer insulating layer 26 will be described in detail.

In more detail, a buffer layer 22 may be formed on the substrate 21 and an active layer 23 may be formed on the buffer layer 22. Thereafter, the active layer 23 may include a source region 23-1, a drain region 23-3, and a channel region 23-2, and the gate insulating layer 24 and the interlayer insulating layer 26 may be formed.

After the above-described process is completed, foreign materials on the interlayer insulating layer 26 may be removed and a photoresist 1 may be arranged on the interlayer insulating layer 26. The photoresist 1 may be one of a positive type or a negative type. That is, when the photoresist 1 is the positive type, portions receiving energy (or light, laser, etc.) are removed, and when the photoresist 1 is the negative type, portions receiving energy may be left after developing the photo resist 1. Hereinafter, for convenience of description, a case where the photoresist 1 is the positive type will be described in detail.

Energy may be applied after arranging the photoresist 1 on the interlayer insulating layer 26 and arranging a mask 2 thereon. An opening may be formed on the mask 2 so as to correspond to a portion of the mask 2 where the photoresist 1 is to be removed. When the photoresist 1 is the negative type, the portion of the mask 2 where the photoresist 1 is to be removed may be blocked to prevent energy from passing therethrough.

After the energy is irradiated to a portion of the photoresist 1 as described above, the mask 2 may be removed and the portion of the photoresist 1 may be removed using a developing solution to form a pattern. The developing solution may then be cleaned.

After forming the patterned photoresist 1 as described above, the substrate 21 may be placed in a chamber 110 and arranged on the supporter 120. When gas is supplied into the chamber 110 through the gas supply 140 while a voltage is applied to the electrode 130, plasma may be formed inside the chamber 110. The plasma may etch the interlayer insulating layer 26 and the gate insulating layer 24 through opening portions of the patterned photoresist 1. Therefore, a contact hole H1 may be formed on the interlayer insulating layer 26 and the gate insulating layer 24.

The first baffle 151 and the second baffle 152 may prevent at least one of process by-products and gas from flowing back into the chamber 110 during the above-described operation.

After the contact hole H1 is formed as described above, the photoresist 1 may be removed by ashing or wet cleaning.

Accordingly, the manufacturing method of the display device may prevent at least one of process by-products and gas from flowing back into the chamber 110, thereby minimizing defects that may occur in the manufacture of a product.

In addition, the manufacturing method of the display device may remove process by-products and gas from the chamber 110 effectively and quickly.

The display device manufacturing method may keep a dry etching rate constant by preventing the concentration of process by-products in the display device from increasing.

Figure 8:
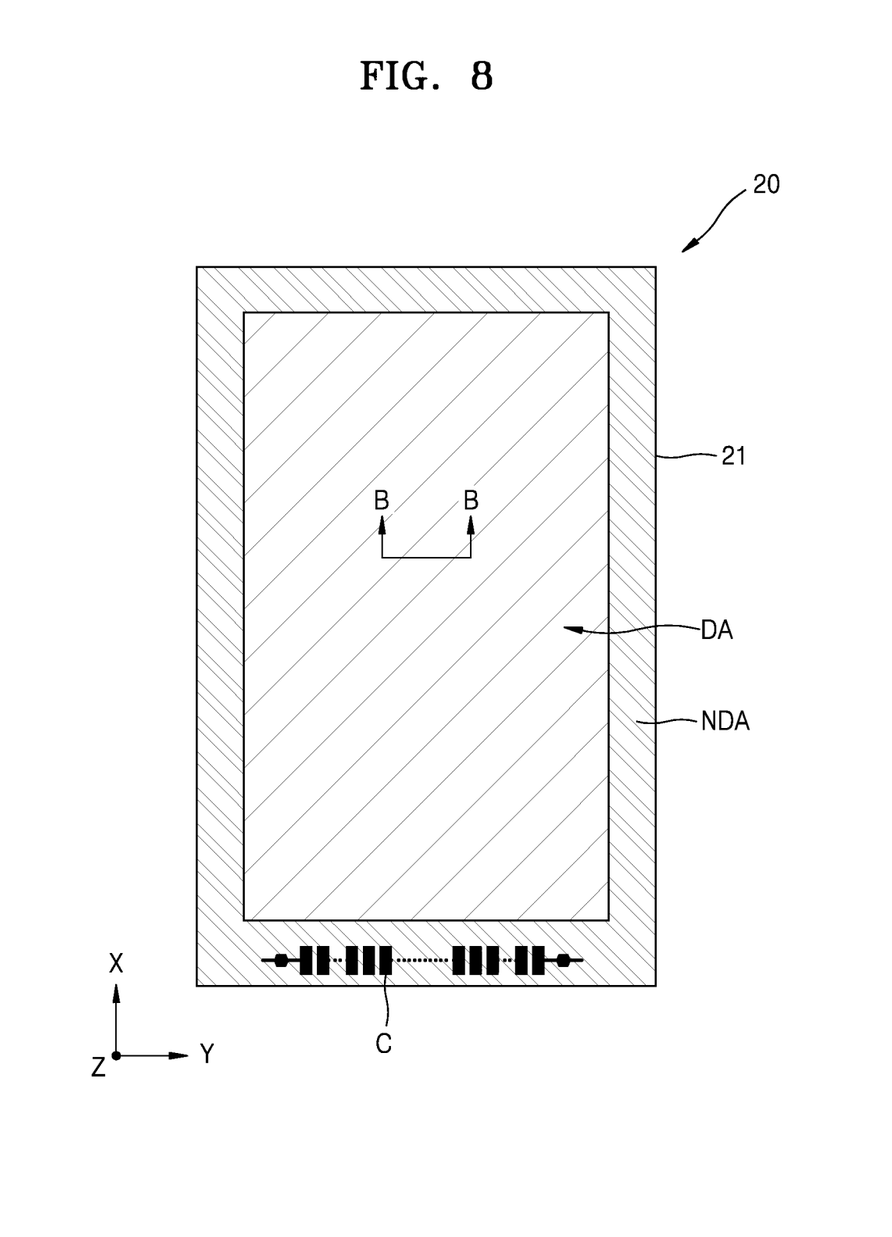
FIG. 8 is a plan view of a display device manufactured by the display device manufacturing apparatus shown in FIG. 1.
Figure 9:
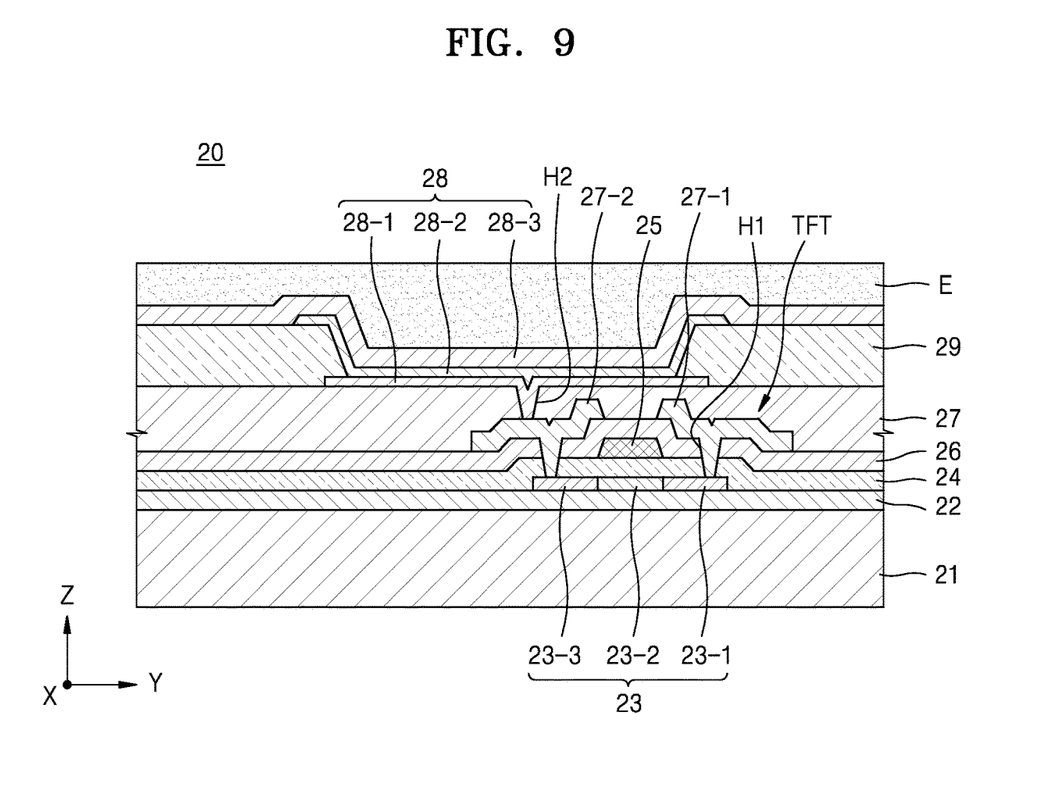
FIG. 9 is a cross-sectional view of the display device, taken along a line B-B of FIG. 8.

FIG. 8 is a plan view of a display device manufactured by the display device manufacturing apparatus shown in FIG. 1. FIG. 9 is a cross-sectional view of the display device, taken along a line B-B of FIG. 8.

Referring to FIGS. 8 and 9, a display device 20 may include a display area DA and a non-display area NDA surrounding the display area DA. A light-emitting area may be in the display area DA, and a power wiring (not shown) may be in the non-display area. Furthermore, a pad area C may be arranged in the non-display area NDA.

The display device 20 may include the substrate 21, a thin-film transistor TFT, a passivation film 27, and a pixel electrode 28-1.

The substrate 21 may include a plastic material, or a metal material such as stainless Steel (SUS) or titanium (Ti). The substrate 21 may include polyimide (PI). For convenience of description, a case where the substrate 21 is formed of PI will be mainly described in detail later below.

The thin-film transistor TFT may be formed on the substrate 21, the passivation film 27 may be formed to cover the thin-film transistor TFT, and an organic light-emitting device (OLED) 28 may be formed on the passivation film 27.

A buffer layer 22 formed of an organic compound and/or an inorganic compound (e.g., SiOx (x≥1) or SiNx (x≥1)) may be further formed on a top surface of the substrate 21.

After the active layer 23 that is arranged to have a predetermined pattern is formed on the buffer layer 22, the active layer 23 may be covered by the gate insulating layer 24. The active layer 23 includes the source region 23-1 and the drain region 23-3, and further includes the channel region 23-2 disposed between the source region 23-1 and the drain region 23-3.

The active layer 23 may include various materials. For example, the active layer 23 may include an inorganic semiconductor material such as amorphous silicon or crystalline silicon. As another example, the active layer 23 may include an oxide semiconductor. As another example, the active layer 23 may include an organic semiconductor material. However, for convenience of description, a case where the active layer 23 is formed of amorphous silicon will be described in detail later below.

The active layer 23 may be formed by forming an amorphous silicon film on the buffer layer 22, crystallizing the amorphous silicon film into a polycrystalline silicon film, and patterning the polycrystalline silicon film. The source region 23-1 and the drain region 23-3 of the active layer 23 may be doped with impurities according to a type of the thin-film transistor TFT such as a driving TFT (not shown) or a switching TFT (not shown).

A gate electrode 25 that corresponds to the channel region 23-2 and an interlayer insulating layer 26 that covers the gate electrode 25 may be formed on a top surface of the gate insulating layer 24.

After the contact hole H1 is formed in the interlayer insulating layer 26 and the gate insulating layer 24, a source electrode 27-1 and a drain electrode 27-2 may be formed on the interlayer insulating layer 26 to respectively contact the source region 23-1 and the drain region 23-3.

The passivation film 27 may be formed on the thin-film transistor TFT. The pixel electrode 28-1 of the OLED 28 may be formed on the passivation film 27. The pixel electrode 28-1 may contact the drain electrode 27-2 of the thin-film transistor TFT through the via hole H2 that is formed in the passivation film 27. The passivation film 27 may be formed of an inorganic material and/or an organic material to have a single-layer structure or a multi-layer structure. The passivation film 27 may be formed as a planarization film having a flat top surface regardless of an uneven surface of a lower film that is disposed below the passivation film 27 or may be a conformal film that has uniform thickness on the lower film. The passivation film 27 may be formed of a transparent insulator to achieve a resonance effect.

After the pixel electrode 28-1 is formed on the passivation film 27, a pixel-defining layer 29 may be formed of an organic material and/or an inorganic material to cover the pixel electrode 28-1 and the passivation film 27 and to allow the pixel electrode 28-1 to be exposed therethrough.

An intermediate layer 28-2 and an opposite electrode 28-3 may be formed on at least the pixel electrode 28-1. In another embodiment, the opposite electrode 28-3 may be formed on the entire surface of a display substrate D. The opposite electrode 28-3 may be formed on the intermediate layer 28-2 and the pixel-defining layer 29. Hereinafter, for convenience of description, a case where the opposite electrode 28-3 is formed on the intermediate layer 28-2 and the pixel-defining layer 29 will be mainly described in detail.

The pixel electrode 28-1 may function as an anode and the opposite electrode 28-3 may function as a cathode. Polarities of the pixel electrode 28-1 and the opposite electrode 28-3 may be switched.

The pixel electrode 28-1 and the opposite electrode 28-3 may be insulated from each other by the intermediate layer 28-2, and different voltages are applied to the pixel electrode 28-1 and the opposite electrode 28-3 such that the intermediate layer 28-2 emits light.

The intermediate layer 28-2 may include an organic emission layer. As another selective example, the intermediate layer 28-2 may include an organic emission layer and may further include at least one of a hole injection layer (HIL), a hole transport layer (HTL), an electron transport layer (ETL), and an electron injection layer (EIL). However, the present embodiment is not limited thereto. The intermediate layer 28-2 may include an organic emission layer and may further include various functional layers (not shown).

A plurality of intermediate layers 28-2 may be provided and form the display area DA. In particular, the plurality of intermediate layers 28-2 may form the display area DA having a shape other than a rectangle and a square shape. The plurality of intermediate layers 28-2 may be arranged to be spaced apart from each other in the display area DA.

One unit pixel includes sub-pixels and the sub-pixels may emit various colors of light. For example, the sub-pixels may respectively emit red light, green light, and blue light or may respectively emit red light, green light, blue light, and white light.

Meanwhile, a thin-film encapsulation layer E may include a plurality of inorganic layers, or an inorganic layer and an organic layer.

The organic layer of the thin-film encapsulation layer E may be formed of a polymer and may be a single layer or stacked layers formed of one of polyethylene terephthalate, PI, polycarbonate, epoxy, polyethylene, and polyacrylate. More specifically, the organic layer may be formed of polyacrylate, and specifically, may include a polymerization of a monomer composition including a diacrylate-based monomer and a triacrylate-based monomer. A monoacrylate-based monomer may be further included in the monomer composition. A well-known photoinitiator such as a TPO may be further included in the monomer composition but is not limited thereto.

The inorganic layer of the thin-film encapsulation layer E may be a single layer or stacked layers including a metal oxide or a metal nitride. In detail, the inorganic layer may include one of silicon nitride film (SiNx), aluminum oxide ($Al_2O_3$), silicon oxide film ($SiO_2$), and titanium oxide ($TiO_2$).

An uppermost layer of the thin-film encapsulation layer E that is exposed to the outside may be an inorganic layer in order to prevent moisture from penetrating into an OLED.

The thin-film encapsulation layer E may include at least one sandwich structure in which at least one organic layer is inserted between at least two inorganic layers. As another example, the thin-film encapsulation layer E may include at least one sandwich structure in which at least one inorganic layer is inserted between at least two organic layers.

The thin-film encapsulation layer E may sequentially include a first inorganic layer, a first organic layer, and a second inorganic layer from an upper portion of the OLED.

As another example, the thin-film encapsulation layer E may sequentially include a first inorganic layer, a first organic layer, a second inorganic layer, a second organic layer, and a third inorganic layer from an upper portion of the OLED.

As another example, the thin-film encapsulation layer E may sequentially include a first inorganic layer, a first organic layer, a second inorganic layer, a second organic layer, a third inorganic layer, a third organic layer, and a fourth inorganic layer from an upper portion of the OLED.

A halogenized metal layer including LiF may be additionally included between the OLED and the first inorganic layer. The halogenized metal layer may prevent the OLED from being damaged when the first inorganic layer is formed by sputtering.

An area of the first organic layer may be smaller than an area of the second inorganic layer, and an area of the second organic layer may also be smaller than an area of the third inorganic layer.

Therefore, the display device 20 does not include any foreign materials, so that a precise image may be realized.

Figure 10:
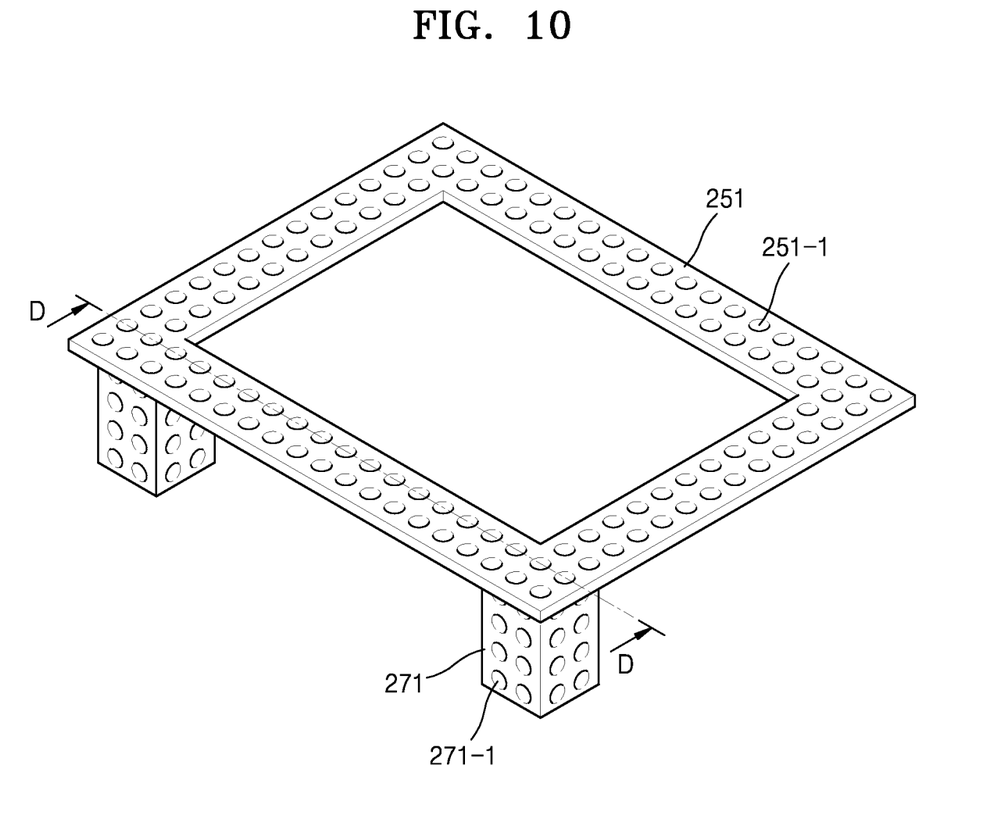
FIG. 10 is a perspective view of a first baffle and a baffle supporter of a display device manufacturing apparatus according to another embodiment.
Figure 11:
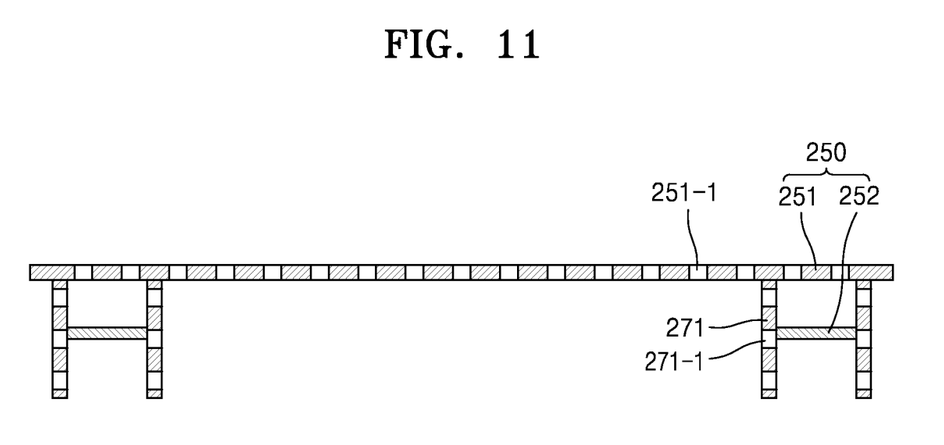
FIG. 11 a cross-sectional view of the first baffle and the baffle supporter, taken along a line D-D of FIG. 10.

FIG. 10 is a perspective view of a first baffle and a baffle supporter of a display device manufacturing apparatus according to another embodiment. FIG. 11 a cross-sectional view of the first baffle and the baffle supporter, taken along a line D-D of FIG. 10.

Referring to FIGS. 10 and 11, the display device manufacturing apparatus may include a chamber, a supporter, an electrode, a gas supply, a baffle and a gas discharger as disclosed in FIG. 1, a baffle supporter 271, and a chamber driver as disclosed in FIG. 1. The chamber, the supporter, the electrode, the gas supply, the gas discharger, and the chamber driver are the same as or similar to those described above in FIGS. 1 to 4, and thus, a detailed description thereof will not be given herein.

The baffle 250 may include a first baffle 251 and a second baffle 252. The first baffle 251 and the second baffle 252 are the same as or similar to those described above, and thus, a detailed description thereof will not be given herein.

The baffle supporter 271 may be connected to the first baffle 251 and the second baffle 252 to support the first baffle 251 and the second baffle 252. The baffle supporter 271 may be on corners of the first baffle 251. The baffle supporter 271 may be arranged so as to completely surround the first baffle 251. In another embodiment, the baffle supporter 271 may be only on a portion of the side surface of the first baffle 251. The baffle supporter 271 may be formed of a plate, and at least one second through hole 271-1 may be formed at the baffle supporter 271 to allow process by-products and gas to pass therethrough. A plurality of second through holes 271-1 may be provided, and the plurality of second through holes 271-1 may be spaced apart from each other.

The manufacturing device for a display device may prevent process by-products and gas discharged to the outside of the chamber 100 from flowing backward to the chamber 100. For example, when process by-products and gas discharged through the gas discharger flow backward, the process by-products and gas may be blocked once by the second baffle 252 which completely covers a guide pipe in a plan view and may further be blocked by the baffle supporter 271. In this case, at least a portion of the second through hole 271-1 may be bent or inclined similarly to a first through hole 251-1.

Therefore, the display device manufacturing apparatus may prevent foreign materials from being generated in a product by discharging some process by-products generated during dry etching and gas used during dry etching to the outside.

Further, the display device manufacturing apparatus may manufacture a high-quality display device.

Figure 12:
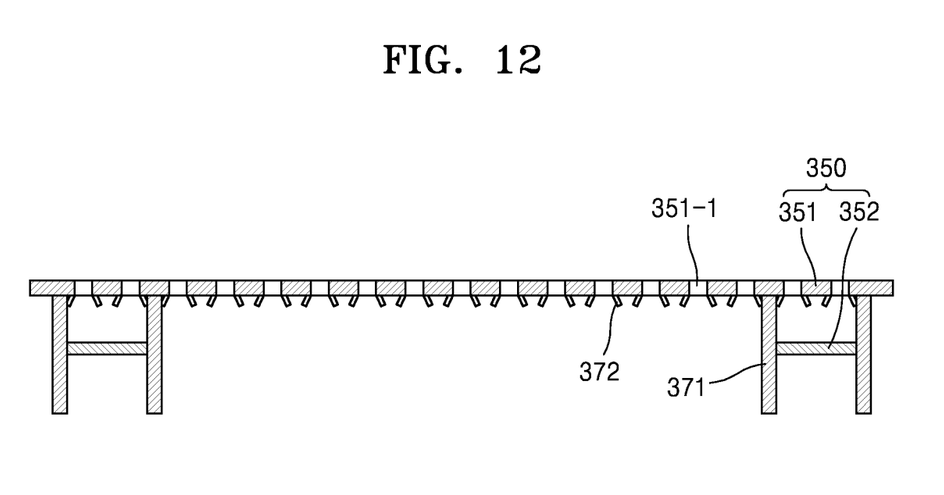
FIG. 12 is a cross-sectional view of a first baffle, a second baffle, and a blocking plate of a display device manufacturing apparatus according to another embodiment.
Figure 13A:
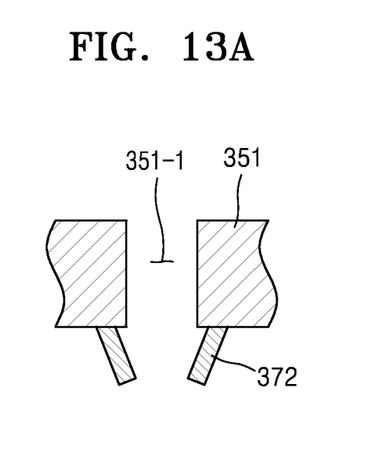
FIGS. 13A, 13B, 13C, 13D and 13E are a sectional view of various embodiments of the blocking plate shown in FIG. 12.
Figure 13B:
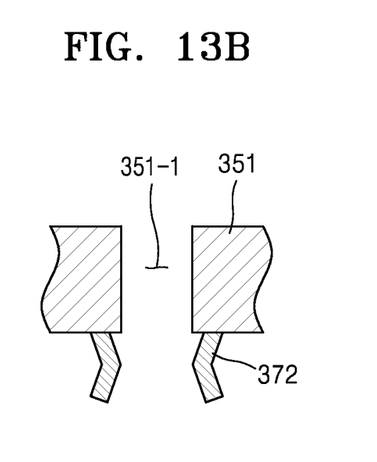
Figure 13C:
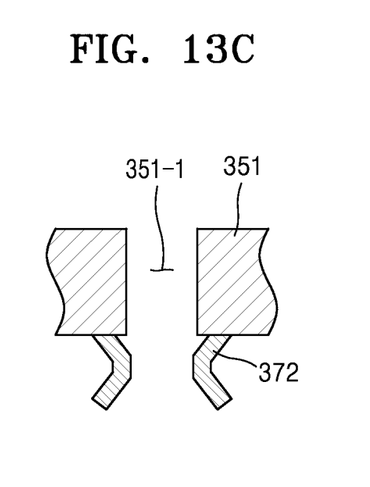
Figure 13D:
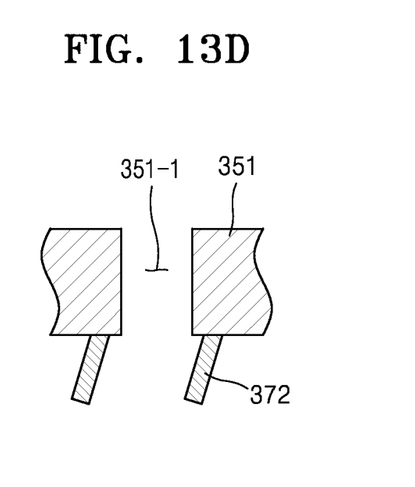
Figure 13E:
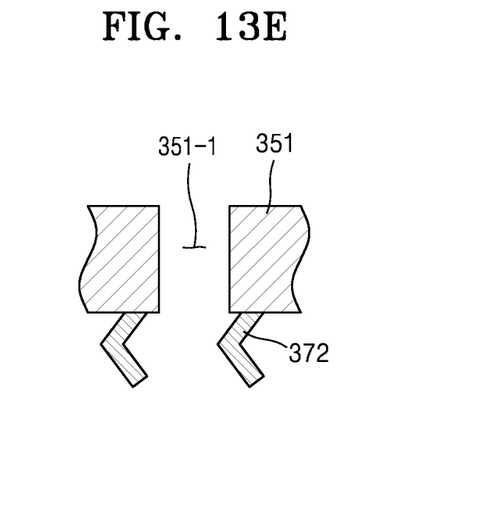

FIG. 12 is a cross-sectional view of a first baffle, a second baffle, and a blocking plate of a display device manufacturing apparatus according to another embodiment. FIG. 13 is a sectional view of various embodiments of the blocking plate shown in FIG. 12.

Referring to FIGS. 12 and 13, the display device manufacturing apparatus may include a chamber, a supporter, an electrode, a gas supply, a baffle 350, a gas discharger as disclosed in FIG. 1, a baffle supporter 371, and a chamber driver as disclosed in FIG. 1. The chamber, the supporter, the electrode unit, the gas supply, the gas discharger, and the chamber driver are the same as or similar to those described above in FIGS. 1 to 4, and thus, a detailed description thereof will not be given herein.

The baffle 250 may include a first baffle 351 and a second baffle 352 arranged to be spaced apart from each other. The first baffle 351 and the second baffle 352 are the same as or similar to those described above in FIGS. 1 to 4, and thus, a detailed description thereof will not be given herein.

The baffle supporter 371 may be connected to the first baffle 351 and the second baffle 352 to support the first baffle 351 and the second baffle 352. The baffle supporter 371 may be one of the shapes shown in FIGS. 1 to 4 or the shapes shown in FIGS. 10 and 11. Hereinafter, for convenience of description, a case where the baffle supporter 371 is formed in a bar shape as shown in FIGS. 1 to 4 will be mainly described in detail.

The display device manufacturing apparatus may include a blocking plate 372 on a lower surface of at least one of the first baffle 351 and the second baffle 352. Here, a plurality of blocking plates 372 may be provided, and the plurality of blocking plates 372 may be arranged to be spaced apart from each other. Hereinafter, for convenience of description, a case where the blocking plates 372 are arranged only on the first baffle 351 will be mainly described in detail.

The blocking plate 372 may protrude from a lower surface of the first baffle 351 toward a guide pipe 361. The blocking plate 372 may be arranged in a region corresponding to the guide pipe 361 in the lower surface of the first baffle 351. The blocking plate 372 may be arranged in a periphery of a first through hole 351-1 formed in the lower surface of the first baffle 351. The blocking plate 372 may be formed on a portion of the periphery of the first through hole 351-1. In another embodiment, the blocking plate 372 may be arranged so as to completely surround the periphery of the first through-hole 351-1. Hereinafter, for convenience of description, a case where the plurality of blocking plates 372 are provided and arranged spaced apart from each other around the first through-hole 351-1 will be mainly described in detail.

A shape of the blocking plate 372 may be similar to a shape of the first through hole 351-1 shown in FIG. 4. For example, as shown in FIG. 12 and FIG. 13 (a), one surface of the blocking plate 372 may be inclined with respect to the lower surface of the first baffle 351. In another embodiment, at least a portion of the blocking plate 372 may protrude into a space between the blocking plates 372 as shown in FIGS. 13 (b) and (c). In another embodiment, the blocking plates 372 may be arranged to be inclined in one direction as shown in FIG. 13 (d). In another embodiment, a portion of the blocking plate 372 protrudes into the space between the blocking plates 372 and the other portion of the blocking plate 372 may be pulled outwardly in the space between the blocking plates 372. However, the shape of the blocking plate 372 is not limited to the above and may include any shape in which at least a portion of the blocking plate 372 is not arranged perpendicularly to the lower surface of the first baffle 351.

The blocking plate 372 may collide with process by-products and gas which flow back in the guide pipe 361 and may guide the process by-products and gas back to the guide pipe 361.

Meanwhile, in addition to the above case, the first through hole 351-1 may be formed in the form of a straight line from the upper surface to the lower surface of the first baffle 351 as shown in FIG. 12. However, the first through hole 351-1 may also be formed as shown in FIG. 4.

Furthermore, the baffle supporter 371 may also be formed as shown in FIGS. 10 and 11, and the second through-hole 271-1 may also be formed as shown in FIG. 4 like the first through hole 351-1.

Therefore, the display device manufacturing apparatus may prevent process by-products and gas from flowing back to the inside of the chamber from the guide pipe through the first baffle 351, the second baffle 352, the baffle supporter 371, and the blocking plate 372.

In addition, the display device manufacturing apparatus may produce a high-quality display device (not shown) by effectively removing process by-products and gas generated during dry etching or deposition.

A display device manufacturing apparatus and a manufacturing method of a display device according to one or more embodiments may prevent foreign materials from being adsorbed on a pattern layer by preventing backflow of gas generated during a process.

The display device manufacturing apparatus and the manufacturing method of a display device according to one or more embodiments may produce a high-quality display device.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A manufacturing method of a display device, the manufacturing method comprising:
    forming a pattern layer on a substrate;
    forming a photoresist pattern on the pattern layer to expose a portion of the pattern layer;
    placing the substrate on a support in a chamber; and
    removing the portion of the pattern layer exposed by the photoresist pattern and discharging by-products from the chamber through a first baffle and a second baffle during the removing the portion of the pattern layer,
    wherein the first baffle has a first through hole through which the by-products is discharged,
    wherein the second baffle overlaps with the first baffle in a plan view, covers the first through hole in a plan view and alter a path of the by-products discharged from the chamber,
    wherein the second baffle completely covers the first through hole in a plan view, and
    wherein the second baffle is in a plate shape having no through hole.

2. The manufacturing method of claim 1, wherein the first through hole in an upper surface and in a lower surface of the first baffle has different areas.

3. The manufacturing method of claim 1, wherein an inner surface of the first through hole is inclined with respect to one of an upper surface and a lower surface of the first baffle.

4. The manufacturing method of claim 1, wherein at least a portion of an inner surface of the first through hole protrudes into the first through hole.

5. The manufacturing method of claim 1, wherein a guide pipe is connected to the chamber so as to guide the by-products inside of the chamber to the outside of the chamber, and the second baffle is disposed between the first baffle and the guide pipe.

6. The manufacturing method of claim 1, wherein the second baffle is arranged to completely cover a hole in a guide pipe.

7. A manufacturing method of a display device, the manufacturing method comprising:
- forming a pattern layer on a substrate;
- forming a photoresist pattern on the pattern layer to expose a portion of the pattern layer;
- placing the substrate on a support in a chamber; and
- removing the portion of the pattern layer exposed by the photoresist pattern and discharging by-products from the chamber through a first baffle and a second baffle during the removing the portion of the pattern layer, wherein the first baffle has a first through hole through which the by-products is discharged, wherein the second baffle covers the first through hole in a plan view and alter a path of the by-products discharged from the chamber, and wherein a blocking plate is arranged on a lower surface of at least one of the first baffle and the second baffle.

8. A manufacturing method of a display device, the manufacturing method comprising:
- forming a pattern layer on a substrate;
- forming a photoresist pattern on the pattern layer to expose a portion of the pattern layer;
- placing the substrate on a support in a chamber; and
- removing the portion of the pattern layer exposed by the photoresist pattern and discharging by-products from the chamber through a first baffle and a second baffle during the removing the portion of the pattern layer, wherein the first baffle has a first through hole through which the by-products is discharged, wherein the second baffle covers the first through hole in a plan view and alter a path of the by-products discharged from the chamber, and wherein the first baffle and the second baffle are supported by baffle supporters spaced apart from each other.

* * * * *